(12) United States Patent
Shamee et al.

(10) Patent No.: US 10,139,704 B1
(45) Date of Patent: Nov. 27, 2018

(54) HIGH-SPEED ANALOG-TO-DIGITAL CONVERTER

(71) Applicant: Raytheon Company, Waltham, MA (US)

(72) Inventors: Bishara Shamee, Playa Del Rey, CA (US); Steven R. Wilkinson, Stevenson Ranch, CA (US); Makan Mohageg, Porter Ranch, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/658,069

(22) Filed: Jul. 24, 2017

(51) Int. Cl.
| H03M 1/00 | (2006.01) |
| G02F 7/00 | (2006.01) |
| H03M 1/12 | (2006.01) |

(52) U.S. Cl.
CPC ............... *G02F 7/00* (2013.01); *H03M 1/12* (2013.01); *G02F 2201/20* (2013.01)

(58) Field of Classification Search
CPC ............. H03M 1/1215; H03M 1/1245; H03M 1/1205; H03M 1/124; H03M 3/43; H03M 3/456; H03M 13/1111; H03M 13/458; H03M 1/1009; H03M 1/1061; H03M 1/12; H03M 1/1265; H03M 1/145; H03M 1/146; H03M 1/168
USPC .......................................... 341/118, 120, 141
See application file for complete search history.

(56) References Cited

U.S. PATENT DOCUMENTS

| 4,694,276 A | 9/1987 | Rastegar |
| 6,118,396 A | 9/2000 | Song |
| 6,661,361 B1 | 12/2003 | Lewis et al. |
| 8,442,402 B1* | 5/2013 | Zanoni ................ H03M 1/1245 341/137 |
| 8,780,948 B2 | 7/2014 | Wilkinson et al. |
| 8,787,767 B2 | 7/2014 | Wilkinson et al. |
| 9,450,597 B1* | 9/2016 | Ahmed ............... H03M 1/1245 |
| 9,933,688 B1 | 4/2018 | Shamee et al. |

(Continued)

OTHER PUBLICATIONS

"U.S. Appl. No. 15/658,048, Non Final Office Action dated Dec. 14, 2017", 12 pgs.

(Continued)

*Primary Examiner* — Linh Nguyen
(74) *Attorney, Agent, or Firm* — Schwegman Lundberg & Woessner, P.A.

(57) ABSTRACT

A high-speed analog-to-digital converter can produce a digital signal representative of an analog input electrical signal. An optical amplitude modulator can modulate an input optical pulse train using the analog input electrical signal. An optical splitter can split the modulated optical pulse train into a plurality of modulated optical pulse trains. Optical path delays can stagger in time the modulated optical pulse trains to form a plurality of time-staggered modulated optical pulse trains. Demodulators can detect and filter the time-staggered modulated optical pulse trains to form a respective plurality of time-averaged voltages. Analog-to-digital converters can output a respective plurality of digital time series representative of the respective time-averaged voltages. An interleaver can aggregate the plurality of digital time series to form the digital signal, which has a sample rate greater than a repetition rate of the input optical pulse train.

14 Claims, 2 Drawing Sheets

(56) References Cited

U.S. PATENT DOCUMENTS

| | | | | |
|---|---|---|---|---|
| 2003/0091116 | A1* | 5/2003 | Yap | H03M 3/47 375/247 |
| 2004/0047640 | A1* | 3/2004 | Knaack | G01H 9/00 398/209 |
| 2004/0141569 | A1* | 7/2004 | Agazzi | H04B 10/2575 375/302 |
| 2008/0031633 | A1* | 2/2008 | Hoshida | H04B 10/677 398/149 |
| 2008/0075472 | A1* | 3/2008 | Liu | H04B 10/5161 398/202 |
| 2010/0142951 | A1* | 6/2010 | Armstrong | H04B 10/67 398/65 |
| 2010/0178065 | A1 | 7/2010 | Nishihara et al. | |
| 2011/0318019 | A1* | 12/2011 | Nissov | H04B 10/2513 398/159 |
| 2012/0213531 | A1 | 8/2012 | Nazarathy et al. | |
| 2012/0280844 | A1* | 11/2012 | Abe | H04B 10/60 341/118 |
| 2013/0315597 | A1* | 11/2013 | Shaver | H04J 14/0227 398/79 |
| 2013/0328706 | A1 | 12/2013 | Marom | |
| 2013/0328708 | A1 | 12/2013 | Raphaeli | |
| 2014/0146234 | A1* | 5/2014 | Chou | H04B 10/69 348/571 |
| 2015/0063378 | A1* | 3/2015 | Nebendahl | H04B 10/614 370/537 |
| 2015/0188556 | A1* | 7/2015 | Chen | H03M 1/188 341/153 |
| 2016/0220709 | A1* | 8/2016 | Olivo | A61K 49/22 |
| 2017/0118009 | A1* | 4/2017 | Wilkinson | H04L 7/0075 |

OTHER PUBLICATIONS

"U.S. Appl. No. 15/658,081, Notice of Allowance dated Nov. 22, 2017".

Chen, Xu, et al., "Photonic-assisted time-interleaved ADC based on optical delay line", Journal of Optics 18, (2016), 1-6.

Esman, Daniel, et al., "High Resolution Broadband Photonic Sampled ADC: 8.0 ENOB at 40 GHz", OECC/ACOFT, (2014), 189-191.

Grein, Matthew, et al., "Demonstration of a photonic analog-to-digital converter scalable to 40 GS/s with 8-bit resolution", CLEO/QELS, JWA90, (2008), 2 pgs.

Kewitsch, Anthony, et al., "All-fiber zero-insertion-loss add-drop filter for wavelength-division multiplexing", Optics Letters / vol. 23, No. 2, (1998), 106-108.

Khilo, Anatol, et al., "Photonic ADC: overcoming the bottleneck of electronic jitter", Optics Express, vol. 20, No. 4. (Feb. 13, 2012). 16 pgs.

Nakazawa, Masataka, et al., "1024 QAM (60 Gbps) single carrier coherent optical transmission over 150 km", Optics Express, vol. 20, No. 11, (May 21, 2012), 7 pgs.

Nejadmalayeri, Amir, et al., "A 16-fs aperture-jitter photonic ADC: 7.0 ENOB at 40 GHz", OSA/CLEO CThI4, (2011), 3 pgs.

Raybon, G, et al., "Single Carrier High Symbol Rate Transmitter for Data Rates up to 1 Tb/s", OFC, Th3A.2, (2016), 3 pgs.

Valley, George C, "Photonic analog-to-digital converters", Optics Express , vol. 15, No. 5, (2007), 28 pgs.

Yariv, A, et al., "Time Interleaved optical sampling for ultra-high speed A/D conversion", Electronic Letters, 8, vol. 34, No. 21, (Oct. 15, 199), 2012-2013.

"U.S. Appl. No. 15/658,048, Response filed Jan. 23, 2018 to Non-Final Office Action dated Dec. 14, 2017", 13 pgs.

"U.S. Appl. No. 15/658,048, Response filed Jun. 25, 2018 to Final Office Action dated Apr. 23, 2018", 10 pgs.

"U.S. Appl. No. 15/658,048, Notice of Allowance dated Jul. 17, 2018", 10 pgs.

\* cited by examiner

HIGH-SPEED ANALOG-TO-DIGITAL CONVERTER

FIELD OF THE DISCLOSURE

The present disclosure relates to a high-speed analog-to-digital converter.

BACKGROUND OF THE DISCLOSURE

As communication systems evolve over time, digital data rates tend to increase. As a result there is ongoing effort to improve the speed and accuracy of analog-to-digital converters.

BRIEF DESCRIPTION OF THE DRAWINGS

Corresponding reference characters indicate corresponding parts throughout the several views. Elements in the drawings are not necessarily drawn to scale. The configurations shown in the drawings are merely examples, and should not be construed as limiting the scope of the invention in any manner.

DETAILED DESCRIPTION

An optical frequency comb is an optical signal that can include a series of periodic pulses, spaced apart equally in time, which can be referred to as an optical pulse train. The spectrum of an optical frequency comb can include multiple spikes (e.g., relatively sharp peaks or delta functions) that are spaced apart equally in frequency. In general, the higher the number of frequencies, the shorter the pulses. Additionally, the wider the spacing between the frequencies, the higher the pulse repetition rate.

The optical pulse train from an optical frequency comb can be used in optical applications that require relatively precise timing, such as an analog-to-digital converter. In some examples of analog-to-digital converters, described in greater detail below, an optical pulse train can provide pulses that can serve two functions. First, the pulses can provide a timing signal, which can trigger optical or electrical elements to perform a particular task. For example, the optical pulses can be formed into a clock signal, the leading edge (or trailing edge) of which can be used to trigger comparators. Second, the pulses can effectively sample an analog waveform, with the intent of producing a digital signal that can represent the analog waveform. For example, for each sample, the analog-to-digital converter can sample the analog waveform over a duration that matches the duration of a pulse in the optical pulse train.

U.S. Pat. No. 8,787,767 provides an example of an optical frequency comb that is suitable for use in the analog-to-digital converters described in detail below. The subject matter of U.S. Pat. No. 8,787,767 is hereby incorporated by reference in its entirety. The optical frequency comb described in U.S. Pat. No. 8,787,767 is but one example of an optical frequency comb; other suitable optical frequency combs can also be used. In some examples, the optical frequency comb can be a Kerr comb.

Figure 1:
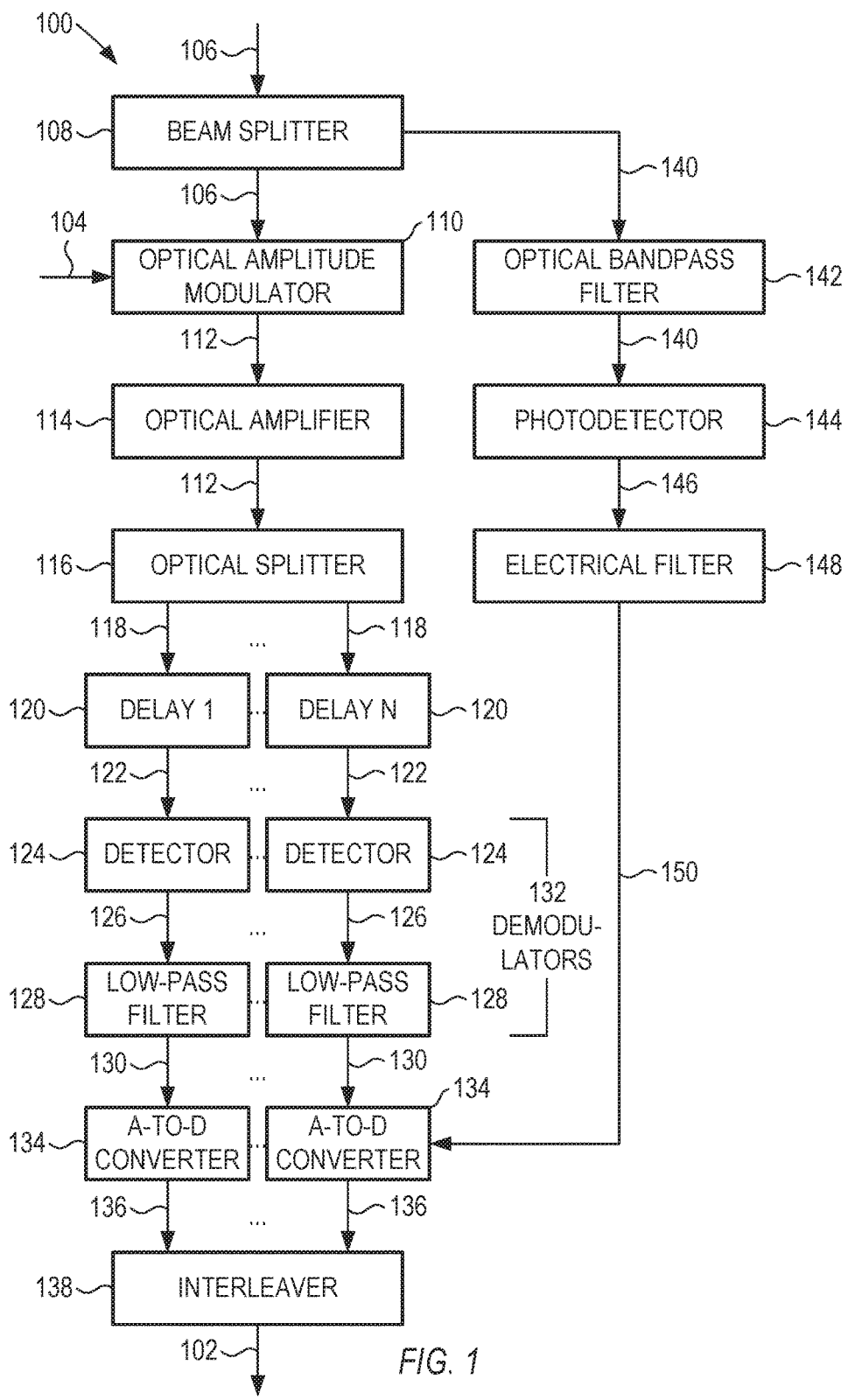
FIG. 1 shows a block diagram of an example of a high-speed analog-to-digital converter, in accordance with some examples.

FIG. 1 shows a block diagram of an example of a high-speed analog-to-digital converter 100 for producing a digital signal 102 representative of an analog input electrical signal 104, in accordance with some examples. FIG. 1 shows but one configuration of a high-speed analog-to-digital converter 100; other suitable configurations can also be used.

An input optical pulse train 106 can be provided by an optical frequency comb, as described above, or by another suitable mechanism. In the input optical pulse train 106, the pulses can be shaped and sized uniformly, from pulse-to-pulse, and spaced apart evenly in time at a constant repetition rate. In some examples, the analog-to-digital converter 100 can be considered to be high-speed, because the sample rate of the analog-to-digital converter 100 can be higher than the repetition rate of the input optical pulse train 106, by a factor of two, three, or more.

In some examples, a beam splitter 108 can split a clock optical pulse train 140 from the input optical pulse train 106. In some examples, the clock optical pulse train 140 has the same pulse repetition rate as the input optical pulse train 106. The clock optical pulse train 140, and its use in forming a timing reference 150, is discussed in detail below.

An optical amplitude modulator 110 can modulate the input optical pulse train 106 using the analog input electrical signal 104 to produce a first modulated optical pulse train 112. In some examples, the optical amplitude modulator 110 is a Mach-Zehnder interferometer configured such that the analog input electrical signal 104 operably modulates one arm of the Mach-Zehnder interferometer. Other suitable modulators can also be used.

In the first modulated optical pulse train 112, the pulse amplitude or magnitude can vary from pulse-to-pule, in a manner that matches the time-evolving amplitude or magnitude of the analog input electrical signal 104. The repetition rate of the first modulated optical pulse train 112 can match the repetition rate of the input optical pulse train 106.

In some examples, an optical amplifier 114 can amplify the first modulated optical pulse train 112. In some examples, the optical amplifier 114 can be a semiconductor optical amplifier, which can pass current through a semiconductor gain medium to amplify light that passes through the optical amplifier 114. An optical amplifier 114 may have a larger bandwidth than a comparable all-electrical amplifier, which can be advantageous. Other suitable amplifiers can also be used.

An optical splitter 116 can split the first modulated optical pulse train 112 into a plurality of modulated optical pulse trains 118. In some examples, the optical splitter 116 can split the first modulated optical pulse train 112 into n modulated optical pulse trains 118, where n is an integer greater than or equal to two. The n modulated optical pulse trains 118 can be interleaved downstream, which can raise the sample rate of the analog-to-digital converter 100 higher than the repetition rate of the input optical pulse train 106, by the factor of n. In some examples, the modulated optical pulse trains 118 are identical to one another, to within typical manufacturing tolerances for the optical splitter 116. The modulated optical pulse trains 118 all have the same variation as one another in pulse amplitude, from pulse-to-pulse, and are in phase with one another (e.g., are synchronized to one another), from pulse-to-pulse.

A plurality of optical path delays 120 can stagger in time the plurality of modulated optical pulse trains 118 to form a plurality of time-staggered modulated optical pulse trains 122. In some examples, the plurality of optical path delays 120 can apply respective time delays to the plurality of modulated optical pulse trains 118. In some examples, the time delays can be different from one another. In some examples, the time delays can be equally spaced apart. In some examples, the spacing between time delays can equal a time interval between sequential pulses of the input optical pulse train 106, divided by n. For example, if 360 degrees represents the time interval between sequential pulses of the input optical pulse train 106, and there are sixteen time-staggered modulated optical pulse trains in the plurality of time-staggered modulated optical pulse trains 122, then the time delays can be spaced apart by a time interval corresponding to 360 degrees divided by sixteen, or 22.5 degrees. This is but one numerical example; other values can also be used.

A plurality of detectors 124 can convert the time-staggered modulated optical pulse trains 122 into respective time-staggered modulated voltage pulse trains 126. In some examples, the detectors 124 can convert the time-staggered modulated optical pulse trains 122 into respective time-staggered modulated current pulse trains. In some examples, the detectors 124 can be photodiodes, which can convert light into current. Other suitable detectors 124 can also be used. In some examples, the plurality of detectors 124 are all identical to one another (or as close as is practical using typical manufacturing tolerances). In some examples, the plurality of detectors 124 can include n detectors, where n is the integer greater than or equal to two that represents the number of modulated optical pulse trains 118 in the plurality of modulated optical pulse trains 118.

A plurality of low-pass filters 128 can time-average the respective plurality of time-staggered modulated voltage pulse trains 122 or time-staggered modulated current pulse trains to form a respective plurality of time-averaged voltages 130 or time-average currents. In some examples, each low-pass filter 128 can have its cutoff frequency comparable to the pulse repetition rate from the input optical pulse train 106, so that the low-pass filter can perform its average over a single pulse of the input optical pulse train 106 (e.g., the time interval between a rising edge of a pulse and a rising edge of the next pulse) without significantly affecting the output from pulse-to-pulse.

Together, each detector 124 and corresponding low-pass filter 128 can be considered to be a demodulator 132. The analog-to-digital converter 100 can therefore include a plurality of demodulators 132 that can detect and filter the plurality of time-staggered modulated optical pulse trains 122 to form a respective plurality of time-averaged voltages 130.

A plurality of analog-to-digital converters 134 can output a respective plurality of digital time series 136 representative of the respective plurality of time-averaged voltages 130. In some examples, one, more than one, or all of the plurality of analog-to-digital converters 134 can be a flash converter, which can provide a relatively high sample rate for the digital time series 136 outputs. In some examples, the analog-to-digital converters 134 can operate in an open-loop manner, without a delay-locked loop, relying on a precision of the optical frequency comb for synchronization.

In some examples, the plurality of analog-to-digital converters 134 can trigger simultaneously using a single timing reference 150 derived from the input optical pulse train 106.

In some examples, the timing reference 150 can be a periodic electrical signal, such as a pulsed signal that corresponds to the input optical pulse train 106, a periodic signal that includes a base frequency corresponding to the repetition rate of the input optical pulse train 106 and one or more additional harmonics, or a single-frequency signal having a frequency corresponding to the pulse repetition rate of the input optical pulse train 106. In some examples, the analog-to-digital converters 134 can trigger synchronously with zero-crossings of one of the leading or trailing edges of the timing reference 150.

Regarding the timing reference 150, the beam splitter 108 can split the clock optical pulse train 140 from the input optical pulse train 106. A series of optical and electrical components can condition the clock optical pulse train 140 to form the timing reference 150. In some examples, an optical bandpass filter 142 can remove at least one frequency from the clock optical pulse train 140. In some examples, a photodetector 144 can convert the clock optical pulse train 140 to a clock electrical pulse train 146. In some examples, an electrical filter 148 can convert the clock electrical pulse train 146 to the timing reference 150. In some examples, the electrical filter 148 can be one of a bandpass filter or a low-pass filter. The timing reference 150 can have at least one frequency that corresponds to the pulse repetition rate.

An interleaver 138 can aggregate the plurality of digital time series 136 to form a digital signal 102 representative of the analog input electrical signal 104. The digital signal 102 can have a sample rate greater than a repetition rate of the input optical pulse train 106. Interleaving n multiple digital time series 136 in this manner can increase the sample rate of the digital signal 102 by a factor of n over each individual analog-to-digital converter 134. For applications that require a very high sampling rate, in which the analog-to-digital converters 134 can be as fast as is practical, the configuration of FIG. 1 can additionally increase the sampling rate by the factor of n.

Figure 2:
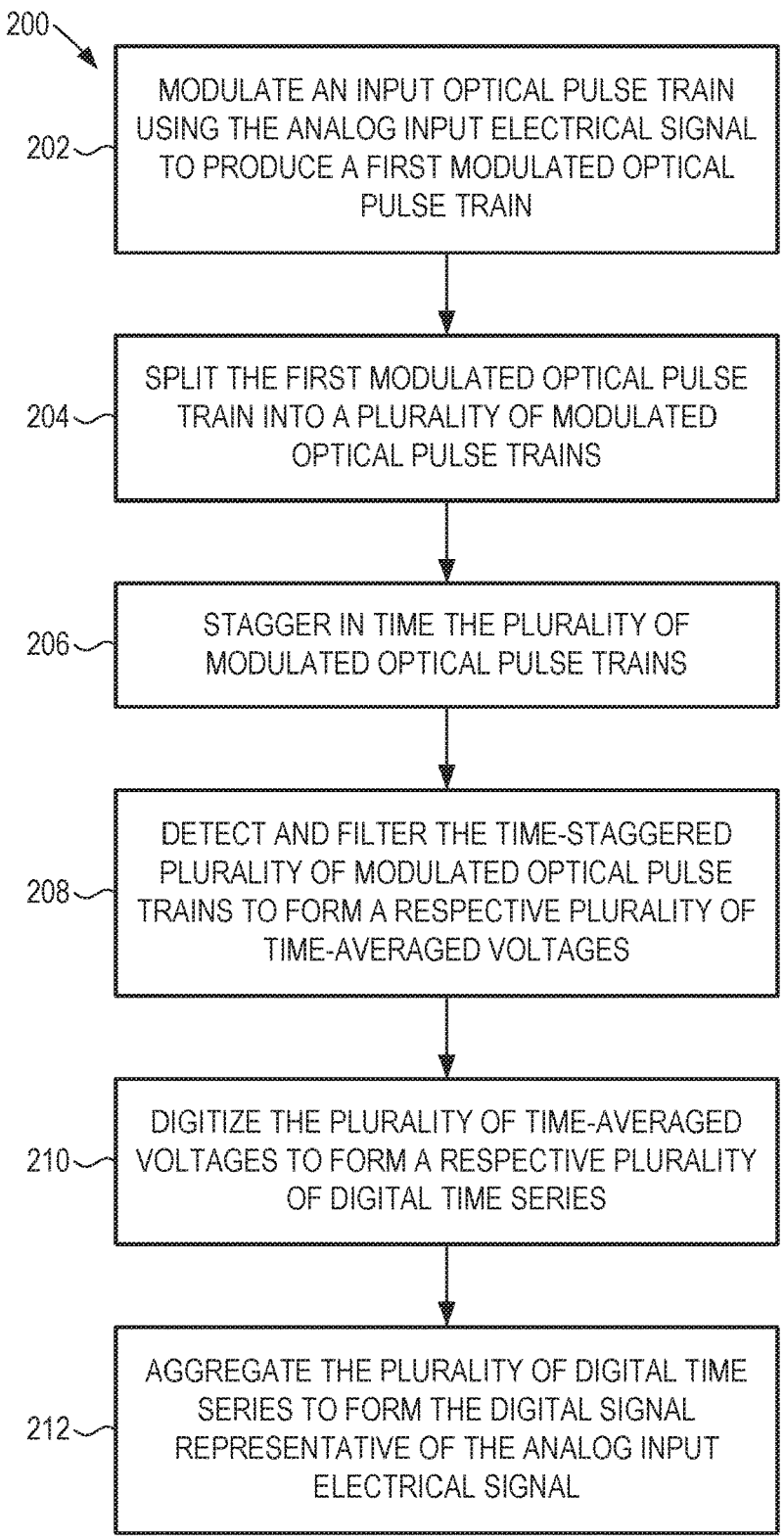
FIG. 2 shows a flowchart of a method for producing a digital signal representative of an analog input electrical signal, in accordance with some examples.

FIG. 2 shows a flowchart of a method 200 for producing a digital signal 102 representative of an analog input electrical signal 104, in accordance with some examples. The method can be executed by a high-speed analog-to-digital converter, such as 100 (FIG. 1). The method 200 of FIG. 2 is but one example of a method for producing a digital signal 102 representative of an analog input electrical signal 104; other suitable methods can also be used.

At operation 202, the high-speed analog-to-digital converter can modulate an input optical pulse train using the analog input electrical signal to produce a first modulated optical pulse train.

At operation 204, the high-speed analog-to-digital converter can split the first modulated optical pulse train into a plurality of modulated optical pulse trains.

At operation 206, the high-speed analog-to-digital converter can stagger in time the plurality of modulated optical pulse trains.

At operation 208, the high-speed analog-to-digital converter can detect and filter the time-staggered plurality of modulated optical pulse trains to form a respective plurality of time-averaged voltages.

At operation 210, the high-speed analog-to-digital converter can digitize the plurality of time-averaged voltages to form a respective plurality of digital time series. In some examples, digitizing the plurality of time-averaged voltages can include triggering a plurality of analog-to-digital converters simultaneously using a single timing reference derived from the input optical pulse train.

At operation 212, the high-speed analog-to-digital converter can aggregate the plurality of digital time series to form the digital signal representative of the analog input electrical signal.

While this invention has been described as having example designs, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A high-speed analog-to-digital converter, comprising:
an optical amplitude modulator configured to modulate an input optical pulse train using an analog input electrical signal to produce a first modulated optical pulse train;
an optical splitter configured to split the first modulated optical pulse train into a plurality of modulated optical pulse trains;
a plurality of optical path delays configured to stagger in time the modulated optical pulse trains to form a plurality of time-staggered modulated optical pulse trains;
a plurality of demodulators configured to detect and filter the time-staggered modulated optical pulse trains to form a respective plurality of time-averaged voltages;
a plurality of analog-to-digital converters configured to output a respective plurality of digital time series representative of the respective plurality of time-averaged voltages, the analog-to-digital converters further configured to trigger simultaneously using a single timing reference derived from the input optical pulse train;
an interleaver configured to aggregate the digital time series to form a digital signal representative of the analog input electrical signal, the digital signal having a sample rate greater than a repetition rate of the input optical pulse train;
a beam splitter configured to split a clock optical pulse train from the input optical pulse train, wherein the input optical pulse train has a pulse repetition rate and the clock optical pulse train has the pulse repetition rate;
a photodetector configured to convert the clock optical pulse train to a clock electrical pulse train; and
an electrical filter configured to convert the clock electrical pulse train to the timing reference, the timing reference having at least one frequency that corresponds to the pulse repetition rate.

2. The high-speed analog-to-digital converter of claim 1, wherein the electrical filter is one of a bandpass filter or a low-pass filter.

3. The high-speed analog-to-digital converter of claim 2, wherein the timing reference has a single frequency that corresponds to the pulse repetition rate.

4. The high-speed analog-to-digital converter of claim 3, wherein the analog-to-digital converters are configured to trigger synchronously with the timing reference.

5. The high-speed analog-to-digital converter of claim 1, wherein the optical path delays are configured to apply respective time delays to the modulated optical pulse trains, the time delays being different from one another.

6. The high-speed analog-to-digital converter of claim 5, wherein the time delays are equally spaced apart.

7. The high-speed analog-to-digital converter of claim 6, wherein the time delays are spaced apart by a spacing, the spacing equaling a time interval between sequential pulses of the input optical pulse train, divided by a number of time-staggered modulated optical pulse trains in the plurality of time-staggered modulated optical pulse trains.

8. The high-speed analog-to-digital converter of claim 1, wherein each demodulator of the plurality of demodulators includes:
a detector configured to convert the respective time-staggered modulated optical pulse train into a respective time-staggered modulated voltage pulse train; and
a low-pass filter configured to time-average the respective time-staggered modulated voltage pulse train to form the respective time-averaged voltage.

9. The high-speed analog-to-digital converter of claim 1, further comprising an optical amplifier configured to amplify the first modulated optical pulse train.

10. The high-speed analog-to-digital converter of claim 1, wherein each of the plurality of analog-to-digital converters is a flash converter.

11. The high-speed analog-to-digital converter of claim 1, wherein the optical amplitude modulator includes a Mach-Zehnder interferometer configured such that the analog input electrical signal operably modulates one arm of the Mach-Zehnder interferometer.

12. A high-speed analog-to-digital converter, comprising:
an optical amplitude modulator configured to modulate an input optical pulse train using an analog input electrical signal to produce a first modulated optical pulse train;
an optical splitter configured to split the first modulated optical pulse train into a plurality of modulated optical pulse trains;
a plurality of optical path delays configured to stagger in time the modulated optical pulse trains to form a plurality of time-staggered modulated optical pulse trains;
a plurality of demodulators configured to detect and filter the time-staggered modulated optical pulse trains to form a respective plurality of time-averaged voltages;
a plurality of analog-to-digital converters configured to output a respective plurality of digital time series representative of the respective plurality of time-averaged voltages, the analog-to-digital converters further configured to trigger simultaneously using a single timing reference derived from the input optical pulse train;
an interleaver configured to aggregate the digital time series to form a digital signal representative of the analog input electrical signal, the digital signal having a sample rate greater than a repetition rate of the input optical pulse train;
a beam splitter configured to split a clock optical pulse train from the input optical pulse train, wherein the input optical pulse train has a pulse repetition rate and the clock optical pulse train has the pulse repetition rate; and
an optical bandpass filter configured to remove at least one frequency from the clock optical pulse train.

13. The high-speed analog-to-digital converter of claim 9, further comprising a photodetector configured to convert the clock optical pulse train to a clock electrical pulse train.

14. A high-speed analog-to-digital converter, comprising:
an optical amplitude modulator configured to modulate an input optical pulse train using an analog input electrical signal to produce a first modulated optical pulse train, the optical amplitude modulator including a Mach-Zehnder interferometer configured such that the analog input electrical signal operably modulates one arm of the Mach-Zehnder interferometer;
an optical splitter configured to split the first modulated optical pulse train into a plurality of modulated optical pulse trains;

a plurality of optical path delays configured to stagger in time the plurality of modulated optical pulse trains to form a plurality of time-staggered modulated optical pulse trains, the plurality of optical path delays further configured to apply respective time delays to the plurality of modulated optical pulse trains, the time delays spaced apart by a spacing, the spacing equaling a time interval between sequential pulses of the input optical pulse train, divided by a number of time-staggered modulated optical pulse trains in the plurality of time-staggered modulated optical pulse trains;

a plurality of demodulators configured to detect and filter the plurality of time-staggered modulated optical pulse trains to form a respective plurality of time-averaged voltages;

a plurality of analog-to-digital converters configured to output a respective plurality of digital time series representative of the respective plurality of time-averaged voltages, the plurality of analog-to-digital converters further configured to trigger simultaneously using a single timing reference derived from the input optical pulse train;

an interleaver configured to aggregate the plurality of digital time series to form a digital signal representative of the analog input electrical signal, the digital signal having a sample rate greater than a repetition rate of the input optical pulse train;

a beam splitter configured to split a clock optical pulse train from the input optical pulse train, wherein the input optical pulse train has a pulse repetition rate and the clock optical pulse train has the pulse repetition rate;

a photodetector configured to convert the clock optical pulse train to a clock electrical pulse train; and an electrical filter configured to convert the clock electrical pulse train to the timing reference, the timing reference having at least one frequency that corresponds to the pulse repetition rate.

* * * * *

UNITED STATES PATENT AND TRADEMARK OFFICE
CERTIFICATE OF CORRECTION

| | |
|---|---|
| PATENT NO. | : 10,139,704 B1 |
| APPLICATION NO. | : 15/658069 |
| DATED | : November 27, 2018 |
| INVENTOR(S) | : Shamee et al. |

Page 1 of 1

It is certified that error appears in the above-identified patent and that said Letters Patent is hereby corrected as shown below:

In the Claims

In Column 6, Line 54, in Claim 13, delete "claim 9," and insert --claim 12,-- therefor Signed and Sealed this
Twenty-first Day of April, 2020

Andrei Iancu
*Director of the United States Patent and Trademark Office*